United States Patent
Bauer et al.

(10) Patent No.: US 6,678,947 B1
(45) Date of Patent: Jan. 20, 2004

(54) METHOD AND DEVICE FOR COMPUTER ASSISTED SELECTION OF SUCTION NOZZLES

(75) Inventors: Petra Bauer, München (DE); Reinhard Enders, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/763,460

(22) PCT Filed: Aug. 13, 1999

(86) PCT No.: PCT/DE99/02536

§ 371 (c)(1),
(2), (4) Date: Jun. 7, 2001

(87) PCT Pub. No.: WO00/11923

PCT Pub. Date: Mar. 2, 2000

(30) Foreign Application Priority Data

Aug. 25, 1998 (DE) .......................................... 198 38 595

(51) Int. Cl.[7] ................................................. H05K 3/30
(52) U.S. Cl. .............................. 29/832; 29/740; 29/741; 29/840
(58) Field of Search .......................... 29/740, 741, 755, 29/832, 840

(56) References Cited

U.S. PATENT DOCUMENTS 5,862,587 A * 1/1999 Higashi
6,161,214 A * 12/2000 Ishihara et al.
6,223,428 B1 * 5/2001 Nonaka et al.
6,336,268 B1 * 1/2002 Inutsuka et al.

FOREIGN PATENT DOCUMENTS

EP 0 036 826 A1 9/1981

OTHER PUBLICATIONS

W.L. Hsu "A Simple Test for the Consecutive Ones Property" Lecture Notes in Computer Science: Algorithms and Computation, vol. 650, S. 459–468, 1992.
R.E. Tarjan et al., "Simple Linear Time Algorithms to Test Chordality of Graphs, Test Acyclicity of Hypergraphs, and Selectively Reduce Acyclic Hypergraphs" SIAM J. Comput., vol. 13 S. 566–579, 1984.
R.K. Ahuja et al. "Network Flows" Prentice Hall, S. 207–242 and 255–258, 1993.
G.L. Nemhauser et al. "Integer and Combinatorial Optimization" Wiley–Interscience, New York, S. 349–379, 1988.

* cited by examiner

*Primary Examiner*—Carl J. Arbes
(74) *Attorney, Agent, or Firm*—Morrison & Foerster LLP

(57) ABSTRACT

Components are allocated to pipettes of different pipette types in accordance with an inverse greedy method or in accordance with a sequence of flow methods or a linear program as a result of which, for a given consecutive-ones characteristic of all the possible allocations, an optimun solution is ensured for a number of cycles, which can be predetermined, for the process of population a printed circuit board by means of an automatic placement machine.

28 Claims, 3 Drawing Sheets

Component classes b — Pipette types p

METHOD AND DEVICE FOR COMPUTER ASSISTED SELECTION OF SUCTION NOZZLES

This application claims priority to International Application No. PCT/DE99/02536 which was published in the German language on Aug. 13, 1999.

DESCRIPTION

TECHNICAL FIELD OF THE INVENTION

The present invention relates to a method and apparatus for computer-aided pipette selection for a placement head of an automatic placement machine, and in particular for allocation of components to the pipette types provided in a pipette selection.

BACKGROUND OF THE INVENTION

A method for checking the so-called consecutive ones characteristic, is described in W. L. HSU, A Simple Test for the Consecutive Ones Property, Lecture Notes in Computer Science: Algorithms and Computation, Vol. 650, pages 459–468, 1992. If the consecutive ones characteristic is present, then the method implicitly provides all the permissible associations to component types.

Various types of placement heads are normally used. One such placement head is, for example, the so-called SP head (Speed Placer-head), by means of which a number of components can be picked up from the component store, transported and successively placed on the printed circuit board.

An SP placement head has a number of segments, (normally 6 or 12 segments), to each of which a pipette can be fitted. The pipettes allow components to be picked up and placed in position. There are various pipette types by means of each of which different types of components can be placed in position. The process of populating a printed circuit board with components by means of an SP placement head normally takes place in a number of iterations (cycles), in each of which the placement head first of all picks up as a maximum the number of components which can be processed and then places them down on the printed circuit board in the same sequence in which it picked them up. The time which is required for one cycle depends only to a minor extent on the number of components picked up and placed in position in this cycle, so that the smallest possible number of cycles for the placement process is the most time-critical criterion relating to the population process.

It is thus desirable to pick up and place in position as many components as possible in the individual cycles, that is to say to avoid "gaps" in the placement process, in association thus to minimize the number of cycles required to place all the components in position.

A method for checking the so-called consecutive ones characteristic, is described in [1]. If the consecutive ones characteristic is present, then the method from [1] implicitly provides all the permissible associations to component types.

A method for checking the so-called acyclic hypergraph characteristic, which has a linear complexity, is described in R. E. Taijan, M. Yannakakis, Simple Linear-Time Algorithms to Test Chordality of Graphs, Test Acyclicity of Hypergraphs, and Selectively Reduce Acyclic Hypergraphs, SIAM J, Comput., Vol. 13, pages 566–579, 1984.

A method for solving a flow problem is described in R. K. Ahuja et al., Network Flows, Prentice Hall, pages 207–242 and 255–258, 1993.

A so-called branch and cut method for optimum solution of an integer linear program is described in G. L. Nemhauser, L. A. Wolsey, Integer and Combinatorial Optimization, Wiley, N.Y., pages 349–379, 1988.

SUMMARY OF THE INVENTION

In one embodiment of the invention, there is a method for computer-aided pipette selection for a placement head of an automatic placement machine and for allocation of components to different pipette types predetermined in a pipette selection for a given number of cycles z. The method using, a stored component type list B with a respectively associated number of components of the component type to be placed, a component type association based on the component types, a stored pipette type list P of available pipette types and an allocation list E which indicates which component types can be placed using what pipette types, and based on the component type association for the pipette types p∈P, a pipette type association is formed in such a manner that $p1 \leq p2 \rightarrow (l(p1) < l(p2)) \lor ((l(p1) = l(p2)) \hat{} f(p1)p2)))$, where p1, p2∈P denote different pipette types, l(p), p∈P, is defined by l(p)=max{b∈B|(b, p)∈E}, f(p), p∈P, is defined by f(p)=min{b∈B|(b, p)∈E}, in which the components are successively allocated to the pipette types, in a sequence which results from the component type association, in the following manner, if, for a component type, pipette types exist to which any given multiple of the number of cycles z of large numbers of components are not already allocated, then pipette types are first allocated to components on the basis of the pipette type association, in such a manner that the number of allocated components is rounded up to the next multiple of the number of cycles z, if any components of this component type remain, then the remaining components are allocated to the last possible pipette type based on the pipette type association and in which the number of components allocated to one pipette type is used to determine the number of pipettes of that pipette type to be selected.

In one aspect of the invention, there is a method for computer-aided pipette selection for a placement head of an automatic placement machine and for allocation of components to the pipette types predetermined in a pipette selection for a given number of cycles z, in which, using a stored component type list B with a respectively associated number of components of the component type to be placed, a stored pipette type list P of available pipette types and an allocation list E which indicates which component types can be placed using what pipette types, determining whether a permissible component type association by carrying out a check, such that (b1, p)∈E, (b2, p)∈E, b1≤b≤b2→(b, p)∈E, where b1, b2, b components in the component type list B are denoted, (b, p)∈E, b∈B , p∈P, denotes the situation where a component of component type b can be placed using a pipette of pipette type p, in which, based on the permissible component type association for the pipette types p∈P, a pipette type association is formed in such a manner that, $p1 \leq p2 \rightarrow (l(p1) \leq 1(p2)) \lor ((l(p1)=1(p2)) \hat{} f(p1) \geq f(p2)))$, where p1, p2∈P denote different pipette types, l(p), p∈P, is defined by l(p)=max{b∈B|(b, p)∈E}, f(p), p∈P, is defined by f(p)=min{b∈B|(b, p)∈E}, in which the components are successively allocated to the pipette types, in a sequence which results from the component type association, in the following manner, if, for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z; if any components of the component type remain, then the remaining components are allocated to the last possible pipette type based on the pipette type association and, in which the number of components allocated to one pipette type is used to determine the number of pipettes of that pipette type to be selected.

In another aspect of the invention, in the situation where no permissible component type association exists, the allocation list E is reduced in size, based on the component types and the pipette types, as many components as possible are allocated successively for each pipette type to the respective pipette type so that a component type association to the component types exists for the resultant allocation list E in such a manner that: (b1, p)∈E, (b2, p)∈E, b1≦b≦b2→(b, p)∈E, in which, for the pipette types p∈P a pipette type association is formed in such a manner that: P1≦P2→(1 (P1)<1(P2))∨((1(P1)=1(P2))^f(P1)≧f(P2))), in which the components are successively allocated to the pipette types, in a sequence which results from the component type association, in the following manner, if, for a component type, pipette types exist to which any given multiple of the number of cycles z of large numbers of components are not already allocated, then pipette types are first allocated to components on the basis of the pipette type association, in such a manner that the number of allocated components is rounded up to the next multiple of the number of cycles z; if any components of this component type remain, then the remaining components are allocated to the last possible pipette type based on the pipette type association and, in which the number of components allocated to one pipette type is used to determine the number of pipettes of that pipette type to be selected.

In still another aspect of the invention, in the situation where no permissible component type association exists, the solution to be determined is found by solving a sequence of flow problems.

In yet another aspect of the invention, in the situation where no permissible component type association exists, a check is carried out to determine whether a set of trees with the pipette types as nodes of the trees can be determined for possible allocations of the component types to the pipette types in accordance with the allocation list E, so that each sub-graph, which is induced from a set of pipette types P(b) which can place a component b, in the set of trees is cohesive, and if such a set of trees can be determined, the solution to be determined is found by solving a sequence of flow problems.

In another aspect of the invention, the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, if such a set of trees cannot be determined, elements are deleted from the allocation list E until such a set of trees can be determined, and the solution to be determined is found by solving a sequence of flow problems.

In yet another aspect of the invention, the sequence of flow problems is formed in accordance with the following rules, $\Sigma x_{bp}=n_b$ p:(b,p)∈E ∀b∈B $\Sigma x_{bp} \leq c_p$ p:(b,p)∈E ∀p∈P, $n_b$ indicates a number of components of the component type b∈E to be placed, $c_p$, p∈P denotes a window which can be predetermined and which is varied in association to form the sequence of flow problems, a first solution variable $x_{bp}$ indicates how many components of the component type b∈B are placed by a pipette of the pipette type p∈P.

In still another aspect of the invention, in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, and in which, if no such set of trees can be determined, the solution to be determined is found by solving a linear program.

In another aspect of the invention, in which the linear program is formed in accordance with the following rules: $n_b$ indicates a number of components of the component type b∈E to be placed, a first solution variable $x_{bp}$ indicates how many components of the component type b∈B are placed by a pipette of the pipette type p∈P, a second solution variable yp indicates how many pipettes of the pipette type p∈P are selected, k denotes a number of segments of the placement head, and x,y≧0 is an integer.

In still another aspect of the invention, the linear program is solved using a branch and cut method.

In yet another aspect of the invention, which is carried out a number of times for a different number of cycles in each case.

In another aspect of the invention, in which the pipettes which have been determined are allocated to the placement head, and the components are placed on a printed circuit board using the placement head.

In another embodiment of the invention, there is an apparatus for computer-aided pipette selection for a placement head of an automatic placement machine and for allocation of components to different pipette types predetermined in a pipette selection for a given number of cycles z, comprising a memory for storing a component type list B, a pipette type list B and an allocation list E; and a processor which is coupled to the memory and stores the following for processing the stored component type list B with the respectively associated number of components of the component type to be placed, a component type association for the component types, a stored pipette type list P of available pipette types and the allocation list E which indicates which component types can be placed by what pipette types, and based on the component type association for the pipette types p∈P, a pipette type association is formed in such a manner that:p1≦p2→(1(p1)<1(p2))∨((1(p1)1(p2))^f(p1)≧f (p2))), where p1, p2∈P denote different pipette types, 1(p), p∈P, is defined by 1(p)=max{b∈B|(b, p)∈E}, f(p), p∈P, is defined by f(p)=min{b∈B|(b, p)∈E}, in which the components are successively allocated to the pipette types, in a sequence which results from the component type association, in the following manner. If for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z, if any components of this component type remain, then the remaining components are allocated to the last possible pipette type based on the pipette type association and, in which the number of components allocated to one pipette type is used to determine the number of pipettes of that pipette type to be selected.

In still another embodiment of the invention, an apparatus for computer-aided pipette selection for a placement head of an automatic placement machine and for allocation of components to the pipette types predetermined in a pipette selection for a given number of cycles z, comprising, a memory for storing a component type list B, a pipette type list B and an allocation list E; and a processor which is coupled to the memory and stores the following for processing, a stored component type list B with the respectively associated number of components of the component type to be placed, a stored pipette type list P of available pipette types and an allocation list E which indicates which component types can be placed by what pipette types, a check is carried out to determine whether a permissible component type association exists, such that (b1, p)∈E, (b2, p)∈E, b1≦b≦b2→(b, p)∈E, where b1, b2, b components in the component type list B are denoted, (b, p)∈E, b∈B , p∈P, denotes the situation where a component of component type b can be placed using a pipette of pipette type p, in which, based on the permissible component type association for the pipette types p∈P, a pipette type association is formed in such a manner that, p1≦p2→(1(p1)<1(p2))∨((1(p1)=1(p2))^f(p1)≧f(p2))), where p1, p2∈P denote different pipette types, 1(p), p∈P, is defined by 1(p)=max{b∈B|(b, p)∈E}, f(p), p∈P, is defined by f(p)=min{b∈B|(b, p)∈E}, in which the components are successively allocated to the pipette types, in a sequence which results from the component type association, in the following manner, if, for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z, if any components of this component type remain, then the remaining components are allocated to the last possible pipette type based on the pipette type association and, in which the number of components allocated to one pipette type is used to determine the number of pipettes of that pipette type to be selected.

In another aspect of the invention, the processor is set up in such a manner that in the situation where no permissible component type association exists, the allocation list E is reduced in size and based on the component types and the pipette types, as many components as possible are allocated successively for each pipette type to the respective pipette type so that a component type association to the component types exists for the resultant allocation list E in such a manner that, (b1, p)∈E, (b2, p)∈E, b1≦b≦b2→(b, p)∈E, in which, for the pipette types p∈P a pipette type association is formed in such a manner that, P1≦P2→(1(P1)<1(P2))∨((1(P1)=1(P2))^f(P1)≧f(P2))), the components are successively allocated to the pipette types, in a sequence which results from the component type association, in the following manner, if, for a component type, pipette types exist to which any given multiple of the number of cycles z of large numbers of components are not already allocated, then pipette types are first allocated to components on the basis of the pipette type association, in such a manner that the number of allocated components is rounded up to the next multiple of the number of cycles z; if any components of this component type remain, then the remaining components re allocated to the last possible pipette type based on the pipette type association and, the number of components allocated to one pipette type is used to determine the number of pipettes of that pipette type to be selected. In still another aspect of the invention, in which the processor is set up in such a manner that in the situation where no permissible component type association exists, a check is carried out to determine whether a set of trees with the pipette types as nodes of the trees can be determined for possible allocations of the component types to the pipette types in accordance with the allocation list E, so that each sub-graph, which is induced from a set of pipette types P(b) which can place a component b, in the set of trees is cohesive, and if such a set of trees can be determined, the solution to be determined is found by solving a sequence of flow problems.

In yet another aspect of the invention, in which the processor is set up in such a manner that in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, if such a set of trees cannot be determined, elements are deleted from the allocation list E until such a set of trees can be determined, and the solution to be determined is found by solving a sequence of flow problems.

In another aspect of the invention, in which the processor is set up in such a manner that the sequence of flow problems is formed in accordance with the following rules, $\Sigma x_{bp}=n_b$ p:(b,p)∈E ∀b∈B $\Sigma x_{bp} \leq c_p$ p:(b,p)∈E ∀p∈P, $n_b$ where $n_b$ indicates a number of components of the component type b∈E to be placed, $c_p$, p∈P denotes a window which can be predetermined and which is varied in association to form the sequence of flow problems, a first solution variable $x_{bp}$ indicates how many components of the component type b∈B are placed by a pipette of the pipette type p∈P.

In yet another aspect of the invention, in which the processor is set up in such a manner that in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, and if such a set of trees cannot be determined, the solution to be determined is found by solving a linear program as the possible allocations are formulated.

In still another aspect of the invention, in which the processor is set up in such a manner that the linear program is formed in accordance with the following rules, $\Sigma x_{bp}=n_b$ p:(b,p)∈E ∀b∈B $\Sigma x_{bp} \leq y_p$ z p:(b,p)∈E ∀p∈P $\Sigma y_p \leq k$ p∈P, $n_b$ where $n_b$ indicates a number of components of the component type b∈E to be placed, a first solution variable $x_{bp}$ indicates how many components of the component type b∈B are placed by a pipette of the pipette type p∈P ; a second solution variable yp indicates how many pipettes of the pipette type p∈P are selected, k denotes a number of segments of the placement head, and x,y≧0 is an integer.

In another aspect of the invention, in which the processor is set up in such a manner that the method is carried out for a different number of cycles in each case.

In still another aspect of the invention, an automatic placement machine having an apparatus as claimed in claim 13 further comprising, a component memory for the component, a placement head for picking up pipettes, at least one pipette for picking up components, a placement device for placing the components on a printed circuit.

In yet another aspect of the invention, the method is carried out a number of times for a different number of cycles in each case.

In another aspect of the invention, in which the pipettes which have been determined are allocated to the placement head, and the components are placed on a printed circuit board using the placement head.

In still another aspect of the invention, in which the processor is set up in such a manner that the method is carried out for a different number of cycles in each case.

In yet another aspect of the invention, a, automatic placement machine having an apparatus further comprising: a component memory for the component, a placement head for picking up pipettes, at least one pipette for picking up components, a placement device for placing the components on a printed circuit.

BRIEF DESCRIPTION OF THE DRAWINGS

The figures illustrate an exemplary embodiment of the invention, which will be explained in more detail in the following text.

DETAILED DESCRIPTION OF THE PREFERRED EMBODIMENTS

Figure 1:
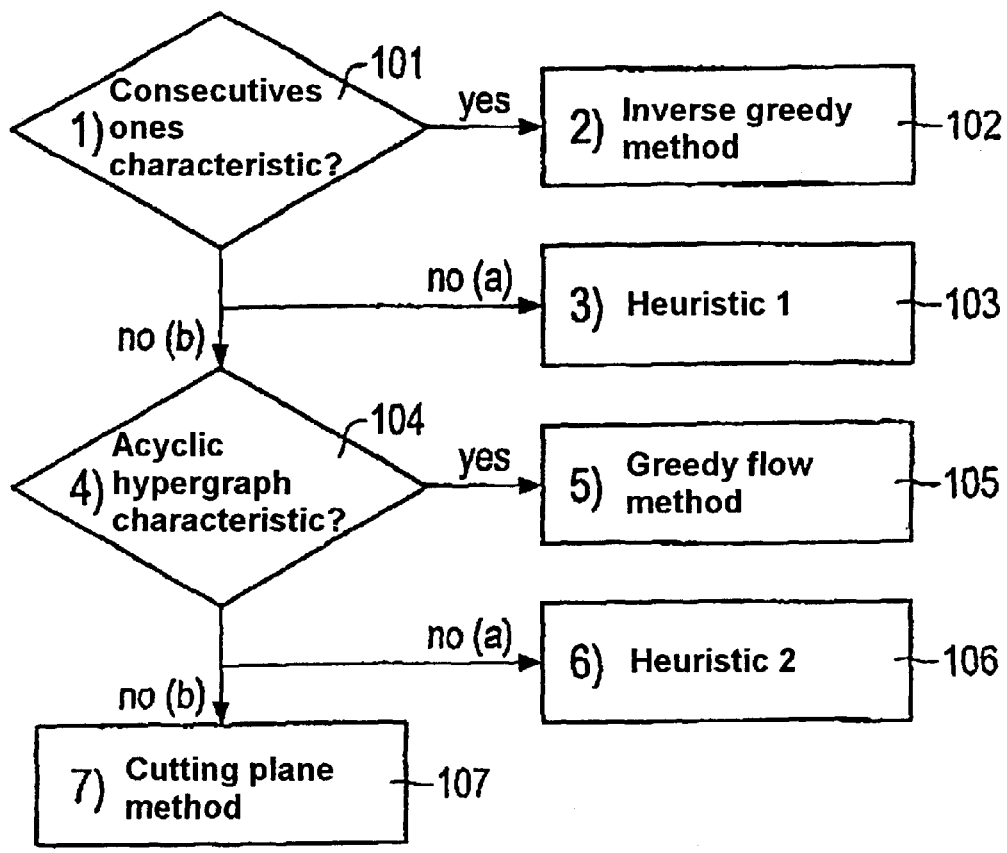
FIG. 1 shows a flow chart which illustrates the method in an exemplary embodiment.

The invention relates to computer-aided pipette selection for a placement head of an automatic placement machine, and to the allocation of components for the pipette types predetermined in a pipette selection.

The invention is based on for a placement head and a predetermined set of components to be placed in position by it, specifying a method and an apparatus for selection of the pipettes to be fitted to the placement head. Additionally, the invention is based on allocation of the components to the pipette types which are included in the pipette selection, by means of which method and apparatus a printed board is populated with the predetermined components in as small a number of cycles as possible.

One method for computer-aided pipette selection for a placement head of an automatic placement machine and for allocation of components to the pipette types predetermined in a pipette selection, for a given number of cycles z, comprises the following:
using
a stored component type list B with a respectively associated number of components of the component type to be placed,
a component type association based on the component types,
a stored pipette type list P of available pipette types and an allocation list E which indicates which component types can be placed using what pipette types, and based on the component type association for the pipette types p∈P, a pipette type association is formed in such a manner that:

$$p1 \leq p2 \rightarrow (1(p1) < 1(p2)) \vee ((1(p1) = 1(p2)) \hat{} f(p1) \geq f(p2))),$$

where p1, p2∈P denote different pipette types,
1(p), p∈P, is defined by $$1(p) = \max\{b \in B | (b, p) \in E\},$$

f(p), p∈P, is defined by $$f(p) = \min\{b \in B | (b, p) \in E\},$$

in which the components are successively allocated to the pipette types, in a sequence which results from the component type association, in the following manner:
if, for a component type, pipette types exist to which any given multiple of the number of cycles z of large numbers of components are not already allocated, then these pipette types are first of all allocated to components on the basis of the pipette type association, in such a manner that the number of allocated components is rounded up where possible to the next multiple of the number of cycles z;
if any components of this component type remain, then these are allocated to the last possible pipette type based on the pipette type association and, in which the number of components allocated to one pipette type is used to determine the number of pipettes of that pipette type to be selected.

A further method for computer-aided pipette selection for a placement head of an automatic placement machine and for allocation of components to the pipette types predetermined in a pipette selection, with a given number of cycles z, comprises the following:
a stored component type list B with a respectively associated number of components of the component type to be placed,
a stored pipette type list P of available pipette types and an allocation list E which indicates which component types can be placed using what pipette types,
a check is carried out to determine whether a permissible component type association exists, that is to say whether:

$$(b1, p) \in E, (b2, p) \in E, b1 \leq b \leq b2 \rightarrow (b, p) \in E,$$

where
b1, b2, b components in the component type list B are denoted,
(b, p)∈E, b∈B, p∈P, denotes the situation where a component of component type b can be placed using a pipette of pipette type p,
based on the permissible component type association for the pipette types p∈P, a pipette type association is formed in such a manner that:

$$p1 \leq p2 \rightarrow (1(p1) < 1(p2)) \vee ((1(p1) = 1(p2)) \hat{} f(p1) \geq f(p2))),$$

where
p1, p2∈P denote different pipette types,
b 1(p), p∈P, is defined by $$1(p) = \max\{b \in B | (b, p) \in E\},$$

f(p), p∈P, is defined by $$f(p)=\min\{b\in B|(b, p)\in E\},$$

the components are successively allocated to the pipette types, in a sequence which results from the component type association, in the following manner:

if, for a component type, pipette types exist to which any given multiple of the number of cycles z of large numbers of components are not already allocated, then these pipette types are first of all allocated to components on the basis of the pipette type association, in such a manner that the number of allocated components is rounded up where possible to the next multiple of the number of cycles z;

if any components of this component type remain, then these are allocated to the last possible pipette type based on the pipette type association and, the number of components allocated to one pipette type is used to determine the number of pipettes of that pipette type to be selected.

An apparatus for computer-aided pipette selection for a placement head of an automatic placement machine and for allocation of components to the pipette types predetermined in a pipette selection, for a predetermined number of cycles z, includes a memory for storing a component type list B, a pipette type list B and an allocation list E, a processor which is coupled to the memory and is set up in such a manner that the following can be carried out:

using the stored component type list B with the respectively associated number of components of the component type to be placed, a component type association for the component types, the stored pipette type list P of available pipette types and the allocation list E which indicates which component types can be placed by what pipette types, and based on the component type association for the pipette types p∈P, a pipette type association is formed in such a manner that:

$$p1 \leq p2 \rightarrow (1(p1)<1(p2))\vee((1(p1)=1(p2))\hat{}f(p1)\geq f(p2))),$$

where p1, p2∈P denote different pipette types,

1(p), p∈P, is defined by $$1(p)=\max\{b\in B|(b, p)\in E\},$$

f(p), p∈P, is defined by $$f(p)=\min\{b\in B|(b, p)\in E\},$$

in which the components are successively allocated to the pipette types, in a sequence which results from the component type association, in the following manner:

if, for a component type, pipette types exist to which any given multiple of the number of cycles z of large numbers of components are not already allocated, then these pipette types are first of all allocated to components on the basis of the pipette type association, in such a manner that the number of allocated components is rounded up where possible to the next multiple of the number of cycles z;

if any components of this component type remain, then these are allocated to the last possible pipette type based on the pipette type association and, in which the number of components allocated to one pipette type is used to determine the number of pipettes of that pipette type to be selected.

A further apparatus for computer-aided pipette selection for a placement head of an automatic placement machine and for allocation of components to the pipette types predetermined in a pipette selection, for a given number of cycles z, includes a memory for storing a component type list B, a pipette type list B and an allocation list E, a processor which is coupled to the memory and is set up in such a manner that the following steps can be carried out:

using a stored component type list B with the respectively associated number of components of the component type to be placed, a stored pipette type list P of available pipette types and an allocation list E which indicates which component types can be placed by what pipette types, a check is carried out to determine whether a permissible component type association exists, that is to say whether:

$$(b1, p)\in E, (b2, p)\in E, b1 \leq b \leq b2 \rightarrow (b, p)\in E,$$

where b1, b2, b components in the component type list B are denoted, (b, p)∈E, b∈B, p∈P, denotes the situation where a component of component type b can be placed using a pipette of pipette type p, in which, based on the permissible component type association for the pipette types p∈P, a pipette type association is formed in such a manner that:

$$p1 \leq p2 \rightarrow (1(p1)<1(p2))\vee((1(p1)=1(p2))\hat{}f(p1)\geq f(p2))),$$

where p1, p2∈P denote different pipette types,

1(p), p∈P, is defined by $$1(p)=\max\{b\in B|(b, p)\in E\},$$

f(p), p∈P, is defined by $$f(p)=\min\{b\in B|(b, p)\in E\},$$

in which the components are successively allocated to the pipette types, in a sequence which results from the component type association, in the following manner:

if, for a component type, pipette types exist to which any given multiple of the number of cycles z of large numbers of components are not already allocated, then these pipette types are first of all allocated to components on the basis of the pipette type association, in such a manner that the number of allocated components is rounded up where possible to the next multiple of the number of cycles z;

if any components of this component type remain, then these are allocated to the last possible pipette type based on the pipette type association and, in which the number of components allocated to one pipette type is used to determine the number of pipettes of that pipette type to be selected.

The invention is advantageous in that the process of populating a printed circuit board with predetermined components can be carried out in as small a number of cycles as possible, in some cases even in an optimum number of cycles, which leads to the population process being speeded up considerably.

In one embodiment, the method checks the so-called consecutive ones characteristic of the possible allocations of the components to the respective predetermined pipette types, that is to say it investigates the question as to whether a permissible component type association exists.

If the consecutive ones characteristic is not satisfied, then, in a development, it is advantageous to reduce the size of the set E of possible allocations of component types to pipette types: based on the component types and the pipette types, as many components as possible are allocated successively for each pipette type to the respective pipette type so that a component type association to the component types exists for the resultant allocation list E in such a manner that:

$$(b1, p) \in E, (b2, p) \in E, b1 \leq b \leq b2 \rightarrow (b, p) \in E.$$

For the pipette types $p \in P$, a pipette type association is formed for the purposes of this development in such a manner that:

$$p1 \leq p2 \rightarrow (1(p1) < 1(p2)) \vee ((1(p1) = 1(p2)) \wedge f(p1) \geq f(p2))),$$

and the components are allocated to the pipette types in a sequence which results from the component type association, in the following manner:
  if, for a component type, pipette types exist to which any given multiple of the number of cycles z of large numbers of components are not already allocated, then these pipette types are first of all allocated to components on the basis of the pipette type association, in such a manner that the number of allocated components is rounded up where possible to the next multiple of the number of cycles z;
  if any components of this component type remain, then these are allocated to the last possible pipette type based on the pipette type association. The number of components allocated to one pipette type is used to determine the number of pipettes of that pipette type to be selected.

Furthermore, in the situation where no permissible component type association exists, the solution to be determined can be found by solving a sequence of flow problems.

In the situation where no permissible component type association exists, a check is carried out to determine whether a set of trees with the pipette types as nodes of the trees can be determined for possible allocations of the component types to the pipette types in accordance with the allocation list E, so that each sub-graph, which is induced from a set of pipette types P(b) which can place a component b, in the set of trees is cohesive, and if such a set of trees can be determined, the pipette types can then be topologically sorted, and the solution to be determined is found by solving a sequence of flow problems.

This refinement results in the population process being carried out with a minimum number of required cycles.

A further preferred refinement provides that, in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive. If such a set of trees cannot be determined, elements are deleted from the allocation list E until such a set of trees can be determined. The solution to be determined is found by solving a sequence of flow problems.

The flow problem can be formed in accordance with the following rules:

$$\sum_{p:(b,p) \in E} x_{bp} = n_b \quad \forall \, b \in B$$

$$\sum_{p:(b,p) \in E} x_{bp} \leq c_b \quad \forall \, p \in P$$

where
  $n_b$ indicates a number of components of the component type $b \in B$ to be placed,
  $c_p$, $p \in P$ denotes a window which can be predetermined and which is varied in association to form the sequence of flow problems,
  a first solution variable $x_{bp}$ indicates how many components of the component type $b \in E$ are placed by a pipette of the pipette type $p \in P$.

In the situation where no permissible association exists, a check can be carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive. If such a set of trees cannot be determined, the solution to be determined can be found by solving a linear program.

The linear program can be formed in accordance with the following rules:

$$\sum_{p:(b,p) \in E} x_{bp} = n_b \quad \forall \, b \in B$$

$$\sum_{p:(b,p) \in E} x_{bp} \leq y_b \cdot z \quad \forall \, p \in P$$

$$\sum_{p \in P} y_p \leq k$$

where
  $n_b$ indicates a number of components of the component type $b \in B$ to be placed,
  a first solution variable $x_{bp}$ indicates how many components of the component type $b \in B$ are placed by a pipette of the pipette type $p \in P$.
  a second solution variable yp indicates how many pipettes of the pipette type $p \in P$ are selected,
  k denotes a number of segments of the placement head, and
  x, $y \geq 0$ is an integer.

This development once again ensures that the population process can be carried out with the optimum number of cycles.

The developments apply both to the method and to the apparatuses, with the processor in each case being set up in such a manner that the methods can be carried out according to the development.

Figure 2:
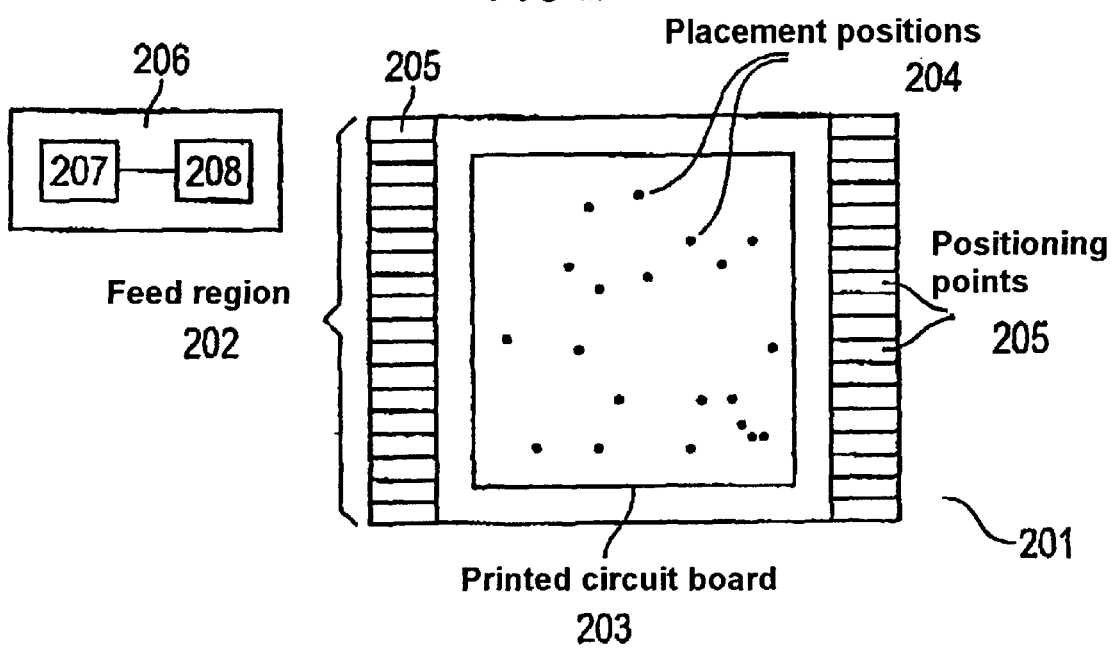
FIG. 2 shows a sketch of an automatic placement machine.

FIG. 2 shows an automatic placement machine 201 with a feed region 202, which includes feed devices with component stores. The component stores includes components which are placed at predetermined placement positions 204 on a printed circuit board 203 by means of the automatic placement machine 201. The components 205 are picked up by a placement head—an SP head or an IC head, are transported to the placement positions, and are placed at the respective placement position on the printed circuit board 203.

The placement head has segments for holding pipettes of different pipette types p∈P by means of which different components can be picked up, transported and placed in position.

Different component types which can each be placed in position using the same set of pipette types can be combined to form so-called component classes and can all be handled as if they were one component type.

It can thus be said that two components belong to the same component class if they can be placed in position using precisely the same pipette types.

The automatic placement machine 201 has an apparatus 206, having a memory 207 and a processor 208, which is connected to the memory 207.

The following lists are stored in the memory 207:
a component type list B in which the component types which are intended to be placed on the printed circuit board 203 are stored, together with the respective number of components.
A pipette type list P, in which the available pipette types are stored.
An allocation list E which states which component types can be placed in position using what pipette types.

According to the method described in the following text, the pipettes to be fitted to the SP placement head for populating the printed circuit board 203 are determined. The placement head is fitted with the pipettes of the appropriate pipette types, and the printed circuit board 203 has the component 205 placed on it in accordance with the predetermined population plan and the predetermined placement positions 204.

Figure 3A:
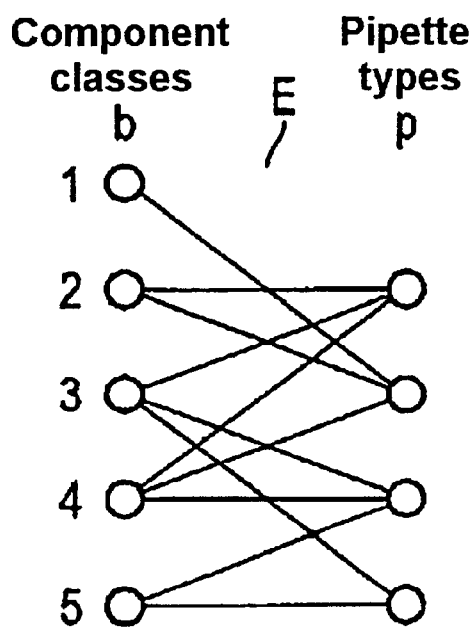
FIGS. 3a and 3b show a sketch of possible allocations of components to pipette types, which satisfy the consecutives ones characteristic.
Figure 3B:
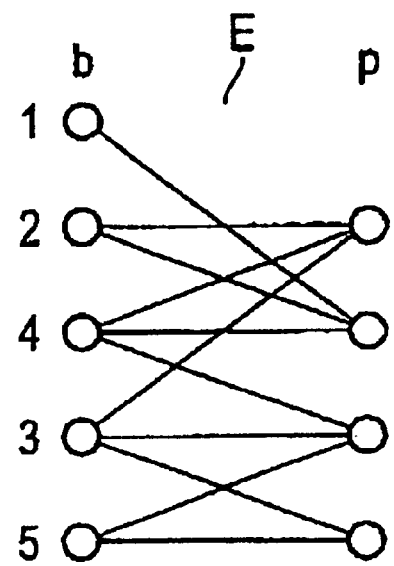

In order to make it easier to understand, the allocation list E can be represented in the form of a bipartite graph (see FIG. 3a and FIG. 3b).

Nodes on the left-hand side of the graph (see FIG. 3a) denote component types, and nodes on the right-hand side of the bipartite graph denote pipette types. Links between the nodes on the left and right-hand sides of the graph indicate that a component of the respective component type can be placed in position using a pipette of the respective pipette type.

The method illustrated in FIG. 1 is carried out in association to allocate the components to the pipettes, and thus in association to select the pipettes from various pipette types for population of the printed circuit board 203.

A placement operation is carried out in at least one cycle, with a cycle in each case denoting a sequence in which the placement head picks up a number of components which can be predetermined, as a maximum its capacity of components, transports them and places them at the appropriate, predetermined placement position 204 on the printed circuit board 203.

The aim is to keep the number of cycles required for a placement process as low as possible. The method described in the following text is carried out iteratively for at least a number of cycles which can be predetermined.

The following procedure is chosen in this case, by means of which a solution to the pipette selection problem, which will be explained in the following text, for the predetermined number of cycles, it is found or determined that no such solution exists for that predetermined number of cycles.

If a solution exists, then the method is ended, while if no solution is determined, then the number of cycles is increased, and the method for solving the pipette selection problem is carried out, until a number of cycles has been determined for which a solution exists.

This procedure can, obviously, be formulated as follows. A trivial lower limit us and an upper limit os are specified for the minimum number z of cycles.

The method comprises the following:
1. Set z=us.
2. Find a permissible solution for the pipette selection problem. If no permissible solution exists and the upper limit os for the number z of cycles has not yet been reached, set z=z+1 and repeat 2.

It has been found that, generally, the optimum number of cycles results from the lower limit us itself or from us+1, so that, generally, one or two iterations of the method are sufficient to determine a solution to the pipette selection problem.

In each iteration, that is to say for a predetermined number of cycles in each case, the method described in the following text is carried out to determine the allocation of the components to the pipettes.

In 101, a check is carried out for the possible allocations of the component types to the various pipette types to determine whether the consecutive ones characteristic is satisfied.

The consecutive ones characteristic is satisfied if:
a component type association in the set of component types can be defined such that:

$$(b1, p)\epsilon E, (b2, p)\epsilon E, b1 \leq b \leq b2 \rightarrow (b, p)\epsilon E,$$

where
$b1, b2, b$ denote components in the component type list B,
$(b, p)\epsilon E, b\epsilon B, p\epsilon P$, denotes the situation where a component of component type b can be placed in position using a pipette of pipette type p, Such a component type association is referred to in the following text as a permissible component type association.

FIG. 3a and FIG. 3b illustrate an example of one possible allocation which satisfies the consecutive ones characteristic.

The two bipartite graphs (FIG. 3a, FIG. 3b) illustrate the component types $b_j$ (j=1, ..., m) the pipette types ($p_i$ (i=1, ..., n) and the set of possible allocations of component types to the pipette types.

In the graphs in FIG. 3b, the component types are arranged in such a manner that those component types which can be placed in position using a pipette of the respective pipette type p∈P follow one another directly for all the pipette types p∈P. The consecutive ones characteristic is accordingly satisfied.

The method described in [1] is used to check the consecutive ones characteristic, using which method a data record can be checked with a linear delay time for the consecutive ones characteristic. If the consecutive ones characteristic is satisfied, then the method from [1] implicitly supplies all the permissible associations to the component types.

When an instance of the pipette selection problem with a consecutive ones characteristic occurs, then, in 102, a method is carried out which is referred to in the following text as the inverse greedy method and whose methods are explained in detail.

The inverse greedy method is used to find, for a predetermined number of cycles z, a minimum number of pipettes which are required to place in position all those components which are to be placed in position, with z cycles. At the same time, the corresponding allocations of the components to the pipettes of the various pipette types and the number of pipettes of the respective pipette type p∈P are determined.

Provided the number of pipettes required is not greater than the number of segments on the placement head, then a solution to the pipette selection problem for z cycles has been found, otherwise no such solution exists.

Before the method is carried out, a pipette type association for the pipette types is formed in such a manner that:

$$p1 \leq p2 \rightarrow (1(p1) < 1(p2)) \vee ((1(p1) = 1(p2)) \hat{} f(p1) \geq f(p2))),$$

where p1, p2∈P denote different pipette types,

1(p), p∈P, is defined by $$1(p) = \max\{b \in B | (b, p) \in E\},$$

f(p), p∈P, is defined by $$f(p) = \min\{b \in B | (b, p) \in E\},$$

Figure 4A:
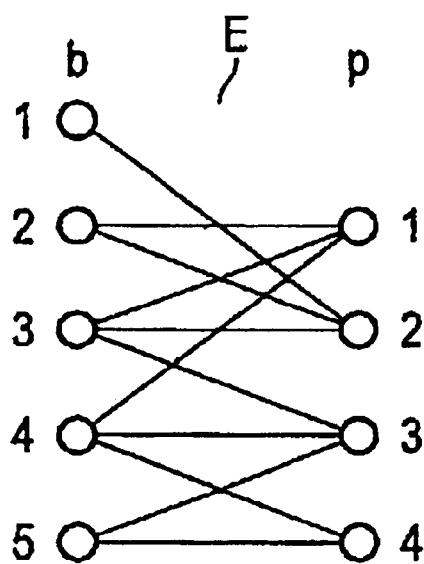
FIGS. 4a and 4b show a sketch of possible allocations of components and pipette types before and after the sorting of the pipette types.
Figure 4B:
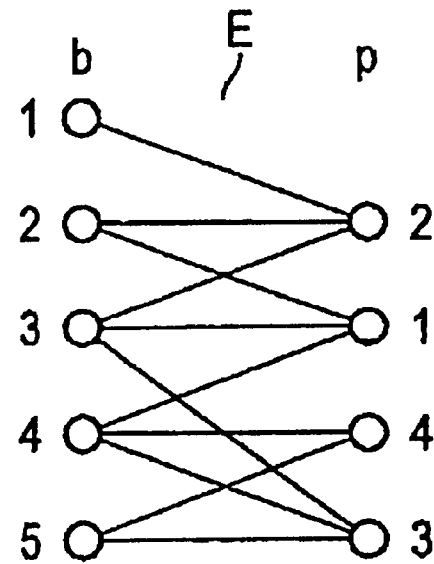

FIGS. 4a and 4b show the example of pipette type association started in FIGS. 3a and 3b. In addition to the component types, the pipette types are also arranged in a suitable manner in the graph in FIG. 4b.

In the inverse greedy method (step 102), the components are successively allocated to the pipette types in a sequence which is governed by the component type association, in the following manner:

if, for a component type, pipette types exist to which any given multiple of the number of cycles z of large numbers of components are not already allocated, then these pipette types are first of all allocated to components on the basis of the pipette type association, in such a manner that the number of allocated components is rounded up where possible to the next multiple of the number of cycles z;

if any components of this component type remain, then these are allocated to the last possible pipette type based on the pipette type association.

The following program routine shows one possible implementation of the inverse greedy method in the form of a computer program in the programming language C.

A first solution variable $x_{bp}$, a second solution variable $y_p$, parameters $n_b$, $t_b$, etc., are referred to by x[bp], y[p], n[b], t[b] etc., in the program routine. In this case, tb is defined by $$tb = \max\{p \in P | (b, p) \in E$$

```
for (j=1; j≤|P|; j++)
{
    for (i=f[p[j]]; i≤1[p[j]]; i++)
    {
        if (p[j]==t(b[i]))
        {
            x[b[i], p[j]]=n[b[i]];
            m[p[j]]+=x[b[i], p[j]];
            n[b[i]]-=x[b[i], p[j]];
        }
        else
            break;
    }
    while ((i≤|B|) && (m[p[j]] mod z 1=0)
    {
        gap=z-(m[p[j]] mod z);
        x[b[i], p[j]]=min{n[b[i]], gap};
        m[p[j]]+=x[b[i], p[j]];
        n[b[i]]-=x[b[i], p[j]];
        i=i+1;
    }
    y[p[j]]=⌈m[p[j]]/z⌉;
}
```

Figure 6:
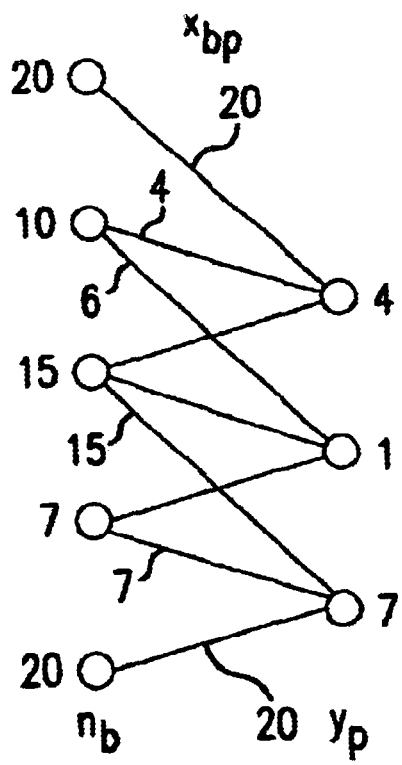
FIG. 6 shows an alternative to the second huristic step or an unacceptibility which can be configured as an integere linear program.2

FIG. 6a illustrates the inverse greedy method and the allocation resulting from this, in the form of a graph, for a further simple example. The following initial situation is assumed.

A number of components (indicated by a figure) which are to be placed on the printed circuit board 203 is stated for each of the five component types. This means that, in this example, the following components of the respective component type must be placed in position:

| first component type:  | 20 components; |
| second component type: | 10 components; |
| third component type:  | 15 components; |
| fourth component type: | 7 components;  |
| fifth component type:  | 20 components. |

Three different pipette types are available for the placement process. The number of nodes used to denote the pipette types in each case indicates the number $y_p$ (second solution variable) of pipettes of the respective pipette type determined by the method.

This thus results in the following distribution of pipettes to the various pipette types:

| first pipette type:  | 4 pipettes; |
| second pipette type: | 1 pipette;  |
| third pipette type:  | 7 pipettes. |

In this example, an allocation is determined for 6 cycles.

The components of the first component type can be placed in position only by using pipettes of the first pipette type, as is illustrated by the link between the two nodes in the graph.

The components of the second component type can be placed in position by pipettes of either the first or second pipette type.

Components of the third component type can be placed in position by pipettes of the first, second or third pipette type.

Components of the fourth component type can be placed in position by pipettes of the second pipette type and pipettes of the third pipette type.

Components of the fifth component type can be placed in position only by pipettes of the third pipette type.

The inverse greedy method 102 starts with the components of the first component type, for which all the components are allocated to the pipettes of the first pipette type in the six cycles. Overall, four pipettes of the first pipette type are required in the six cycles (6×4=24) in order to place in position all 20 components of the first component type using the pipettes of the first pipette type. The 20 components of the first component type are thus allocated to the pipettes of the first pipette type.

The components of the second component type (10 components) are then allocated to the pipettes. The pipettes of the first pipette type still have a free capacity of four components (24−20=4 components) in the six cycles, which can be placed in position by pipettes of the first pipette type in the six cycles. Four of the 10 components of the second component type are thus allocated to the pipettes of the first pipette type since, if possible, the pipettes are "filled" with the components during the allocation process. The remaining six components of the second component type are allocated to a pipette of the second pipette type, since a pipette of the second pipette type can place in position a total of six components in the six cycles.

Additionally, the components of the third component type (15 components) are allocated to the pipettes. The pipettes of the first pipette type and the second pipette type are already in use, so that the 15 components of the third component type are allocated to pipettes of the third pipette type. Seven pipettes of the third pipette type are required for this purpose. The seven components of the fourth component type and the 20 components of the fifth component type are likewise allocated to pipettes of the third pipette type. Overall, 7×6=42 components can be placed in position using the seven pipettes of the third pipette type. This is precisely equal to the number of components of the third component type, of the fourth component type and of the fifth component type which are intended to be placed in position.

A solution thus exists for the allocation process in accordance with the inverse greedy method (102) for 6 cycles, and the placement process can continue on the basis of this allocation. The result of the method is given by the number of pipettes in the respective pipette types which are required, and by the allocation of the components to the pipette types.

It should be stressed that the inverse greedy method, as is still to be explained in the following text, indicates an optimum solution to the pipette selection problem in the situation where the consecutive ones characteristic is satisfied for the possible allocations.

The situation in which it is no longer possible to guarantee that the solution represents an optimum solution to the pipette selection problem in the mathematical sense is that when the consecutive ones characteristic is not satisfied.

If the consecutive ones characteristic (101) is not satisfied, then one of the variants (103 or 104), which are explained in the following text, is carried out.

In the course of a first heuristic (103), and based on a blank graph, that is to say a set of component types and pipette types but without allocations, which from the trivial point of view satisfies the consecutive ones characteristic, the individual pipette types p∈P are considered successively and as many edges (p, b)∈E as possible are added to the graph, without losing the consecutives ones characteristic. The inverse greedy method described above is now carried out on the resultant graph, which now includes fewer edges than the original graph, but which satisfies the consecutive ones characteristic.

In a further variant of the method, the disclosure in 104 can also be used to investigate the possible allocations for the following characteristic, which is referred to in the following text as the acyclic hypergraph characteristic:

a set of trees W (wood W) exists with the pipette types P as nodes, so that each sub-graph, which is induced from a set of pipette types P(b) which can place a component b, in the wood W is cohesive.

If the acyclic hypergraph characteristic is satisfied, then the pipette types are sorted topologically on the basis of the wood W, that is to say a linear association is established for the pipette types.

A method for checking for the acyclic hypergraph characteristic and which has linear complexity is known from [2].

Figure 5A:
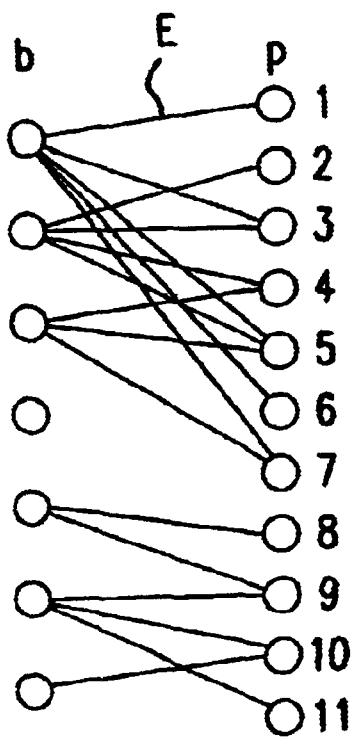
FIGS. 5a and 5b show a sketch of possible allocations which satisfy the acyclic hypergraph characteristic.
Figure 5B:
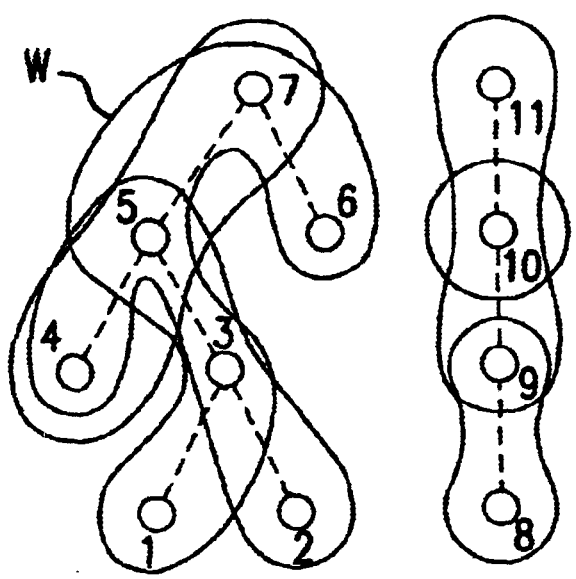

In order to clarify this characteristic, FIGS. 5a and 5b firstly show an allocation list E with component types and pipette types (FIG. 5a) and a wood with the required characteristics; the numbers define a desired linear association (FIG. 5b).

If the acyclic hypergraph characteristic is satisfied, then a method which is described in the following text as the greedy flow method is carried out in 105. The pipette selection problem is formulated as a sequence $PAP_c$ of flow problems in accordance with the following rules:

$$(PAP_c)$$

$$\sum_{p:(b,p)\in E} x_{bp} = n_b \quad \forall\, b \in B$$

$$\sum_{p:(b,p)\in E} x_{bp} \leq c_b \quad \forall\, p \in P$$

where
- $n_b$ indicates a number of components of the component type b∈E to be placed,
- $c_p$, p∈P denotes a window which can be predetermined and which is varied in association to form the sequence of flow problems,
- a first solution variable $x_{bp}$ indicates how many components of the component type b∈B are placed by a pipette of the pipette type p∈P.

The method described in [3] is used to solve such a flow problem.

The computer program which is described in the following text and in which a sequence of flow problems of the above type are solved is used to solve the pipette selection problem, with the limits $c_p$ (c[p] in the program) being varied. The linear association of the pipette types is given by $$P1 \leq P2 \leq \ldots \leq P|P|$$

```
for (j=1; j≤|P|; j++)
    c[p[j]]=⌈n_ges/z⌉*z;
for (j=1; j≤|P|; j++)
    for (c[p[j]]=0; c[p[j]]≤⌈n_ges/z⌉* z; c[p[j]]+=z)
        if (is_feasible (PAP_c))
        {
            y[p[j]]=c[p[j]]/z;
            break;
        }
```

The allocations, that is to say the values for $x_{bp}$ are obtained from the solution of the respective last flow problem.

Furthermore, if $$\sum_{p \in P} y_p > k,$$

where k denotes the number of segments in the placement head, no solution exists with the number of cycles z.

If the check for the acyclic hypergraph characteristic (104) gives a negative result, that is to say the characteristic is not satisfied, then a method is carried out which comprises two possible methods (106 or 107) which are described in the following text.

In a first variant (106), a method is carried out in the course of a second heuristic in which edges have been deleted from the allocation graph, so that, in accordance with the method described above, a wood W having the acyclic hypergraph characteristic can be formed. It is advantageous in this case to ensure that as few edges as possible are deleted. The greedy flow method is then applied to the resultant graph.

It should be stressed that the greedy flow method can be carried out for any linear association to the pipette types P. In the general case there is no guarantee that no solution is found using the greedy flow method. Nevertheless, very good results are also achieved using the greedy flow method.

As an alternative to the second heuristic (106), the pipette selection problem can be formulated and solved, or its unacceptability can be confirmed, as an integer linear program. The linear program $PAP_z$ for the pipette selection problem is formulated in accordance with the following rules:

$$\sum_{p:(b,p)\in E} x_{bp} = n_b \quad \forall\, b \in B$$

$$\sum_{p:(b,p)\in E} x_{bp} \leq y_b \cdot z \quad \forall\, p \in P$$

$$\sum_{p\in P} y_p \leq k$$

where $n_b$ indicates a number of components of the component type b∈E to be placed, a first solution variable $x_{bp}$ indicates how many components of the component type b∈B are placed by a pipette of the pipette type p∈P.

a second solution variable yp indicates how many pipettes of the pipette type p∈P are selected, k denotes a number of segments of the placement head, and x, y≧0 is an integer.

An integer linear program is optimally deleted by the known branch and cut method, as is described in [4].

If the allocation of the components to the pipettes of the various pipette types, and thus the allocation of the pipettes and pipette types to the placement head are determined in accordance with the method described above, then the placement process is carried out on the basis of this allocation, using the pipettes which have been determined.

The respective method variant is selected as a function of the computation time available for carrying out the method.

What is claimed is:

1. A method for computer-aided pipette selection for a placement head of an automatic placement machine and for allocation of components to different pipette types predetermined in a pipette selection for a given number of cycles z, comprising:

a stored component type list B with a respectively associated number of components of the component type to be placed;

a component type association based on the component types; and a stored pipette type list P of available pipette types and an allocation list E which indicates which component types can be placed using what pipette types, and based on the component type association for the pipette types p∈P, a pipette type association is formed in such a manner that:

$$p1 \leq p2 \rightarrow (1(p1)<1(p2)) \vee ((1(p1)=1(p2)) \hat{}\, f(p1) \geq f(p2))),$$

where p1, p2∈P denote different pipette types,

1(p), p∈P, is defined by $$1(p)=\max\{b\in B|(b,p)\in E\},$$

f(p), p∈P, is defined by $$f(p)=\min\{b\in B|(b,p)\in E\},$$

in which the components are successively allocated to the pipette types, in a sequence which results from the component type association, in the following manner:

if, for a component type, pipette types exist to which any given multiple of the number of cycles z of large numbers of components are not already allocated, then pipette types are first allocated to components on the basis of the pipette type association, in such a manner that the number of allocated components is rounded up to the next multiple of the number of cycles z;

if any components of this component type remain, then the remaining components are allocated to the last possible pipette type based on the pipette type association and, in which the number of components allocated to one pipette type is used to determine the number of pipettes of that pipette type to be selected.

2. A method for computer-aided pipette selection for a placement head of an automatic placement machine and for allocation of components to different pipette types predetermined in a pipette selection for a given number of cycles z, comprising:

a stored component type list B with a respectively associated number of components of the component type to be placed;

a stored pipette type list P of available pipette types and an allocation list E which indicates which component types can be placed using what pipette types; and determining whether a permissible component type association by carrying out a check, such that $$(b1, p)\in E, (b2, p)\in E, b1\leq b\leq b2\rightarrow(b, p)\in E,$$

where b1, b2, b components in the component type list B are denoted, (b, p)∈E, b∈B , p∈P, denotes the situation where a component of component type b can be placed using a pipette of pipette type p, in which, based on the permissible component type association for the pipette types p∈P, a pipette type association is formed in such a manner that:

$$p1 \leq p2 \rightarrow (1(p1)<1(p2)) \vee ((1(p1)=1(p2)) \hat{}\, f(p1) \geq f(p2))),$$

where p1, p2∈P denote different pipette types,

1(p), p∈P, is defined by $$1(p)=\max\{b\in B|(b,p)\in E\},$$

f(p), p∈P, is defined by $$f(p)=\min\{b\in B|(b, p)\in E\},$$

in which the components are successively allocated to the pipette types, in a sequence which results from the component type association, in the following manner:

if, for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z;

if any components of the component type remain, then the remaining components are allocated to the last possible pipette type based on the pipette type association and,
in which the number of components allocated to one pipette type is used to determine the number of pipettes of that pipette type to be selected.

3. The method as claimed in claim 2, wherein
in the situation where no permissible component type association exists, the allocation list E is reduced in size,
based on the component types and the pipette types, as many components as possible are allocated successively for each pipette type to the respective pipette type so that a component type association to the component types exists for the resultant allocation list E in such a manner that:

$(b1, p) \in E, (b2, p) \in E, b1 \leq b \leq b2 \rightarrow (b,p) \in E,$ in which, for the pipette types $p \in P$ a pipette type association is formed in such a manner that:

$P1 \leq P2 \rightarrow (1(P1) < 1(P2)) \vee ((1(P1) = 1(P2)) \hat{} f(P1) \geq f(P2))),$ in which the components are successively allocated to the pipette types, in a sequence which results from the component type association, in the following manner:
  if, for a component type, pipette types exist to which any given multiple of the number of cycles z of large numbers of components are not already allocated, then pipette types are first allocated to components on the basis of the pipette type association, in such a manner that the number of allocated components is rounded up to the next multiple of the number of cycles z;
  if any components of this component type remain, then the remaining components are allocated to the last possible pipette type based on the pipette type association and,
  in which the number of components allocated to one pipette type is used to determine the number of pipettes of that pipette type to be selected.

4. The method as claimed in claim 2
wherein in the situation where no permissible component type association exists, the solution to be determined is found by solving a sequence of flow problems.

5. The method as claimed in claim 2, wherein
in the situation where no permissible component type association exists, a check is carried out to determine whether a set of trees with the pipette types as nodes of the trees can be determined for possible allocations of the component types to the pipette types in accordance with the allocation list E, so that each sub-graph, which is induced from a set of pipette types P(b) which can place a component b, in the set of trees is cohesive, and
if such a set of trees can be determined, the solution to be determined is found by solving a sequence of flow problems.

6. The method as claimed in claim 2,
wherein the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, if such a set of trees cannot be determined, elements are deleted from the allocation list E until such a set of trees can be determined, and
the solution to be determined is found by solving a sequence of flow problems.

7. The method as claimed in claim 4,
in which the sequence of flow problems is formed in accordance with the following rules:

$$\sum_{p:(b,p) \in E} x_{bp} = n_b \quad \forall\, b \in B$$

$$\sum_{p:(b,p) \in E} x_{bp} \leq c_b \quad \forall\, p \in P$$

where
  $n_b$ indicates a number of components of the component type $b \in E$ to be placed,
  $c_p$, $p \in P$ denotes a window which can be predetermined and which is varied in association to form the sequence of flow problems,
  a first solution variable $x_{bp}$ indicates how many components of the component type $b \in B$ are placed by a pipette of the pipette type $p \in P$.

8. The method as claimed in claim 2, wherein
in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, and
in which, if no such set of trees can be determined, the solution to be determined is found by solving a linear program.

9. The method as claimed in claim 8, wherein in which the linear program is formed in accordance with the following rules:

$$\sum_{p:(b,p) \in E} x_{bp} = n_b \quad \forall\, b \in B$$

$$\sum_{p:(b,p) \in E} x_{bp} \leq y_b \cdot z \quad \forall\, p \in P$$

$$\sum_{p \in P} y_p \leq k$$

where
  $n_b$ indicates a number of components of the component type $b \in E$ to be placed,
  a first solution variable $x_{bp}$ indicates how many components of the component type $b \in B$ are placed by a pipette of the pipette type $p \in P$,
  a second solution variable yp indicates how many pipettes of the pipette type $p \in P$ are selected,
  k denotes a number of segments of the placement head, and $x, y \geq 0$ is an integer.

10. The method as claimed in claim 9,
wherein the linear program is solved using a branch and cut method.

11. The method as claimed in claim 1
which is carried out a number of times for a different number of cycles in each case.

12. The method as claimed in claim 1 in which the pipettes which have been determined are allocated to the placement head, and the components are placed on a printed circuit board using the placement head.

13. The method as claimed in claim 2, which is carried out a number of times for a different number of cycles in each case.

14. The method as claimed in claim 2, in which the pipettes which have been determined are allocated to the placement head, and the components are placed on a printed circuit board using the placement head.

15. An apparatus for computer-aided pipette selection for a placement head of an automatic placement machine and for allocation of components to different pipette types predetermined in a pipette selection for a given number of cycles z, comprising:

a memory for storing a component type list B, a pipette type list B and an allocation list E; and a processor which is coupled to the memory and stores the following for processing:

the stored component type list B with the respectively associated number of components of the component type to be placed, a component type association for the component types, a stored pipette type list P of available pipette types and the allocation list E which indicates which component types can be placed by what pipette types, and based on the component type association for the pipette types p∈P, a pipette type association is formed in such a manner that:

$$p1 \leq p2 \rightarrow (1(p1) < 1(p2)) \vee ((1(p1) = 1(p2)) \wedge f(p1) \geq f(p2))),$$

where
p1, p2∈P denote different pipette types,
1(p), p∈P, is defined by $$1(p) = \max\{b \in B | (b, p) \in E\},$$

f(p), p∈P, is defined by $$f(p) = \min\{b \in B | (b, p) \in E\},$$

in which the components are successively allocated to the pipette types, in a sequence which results from the component type association, in the following manner:

if, for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z;

if any components of this component type remain, then the remaining components are allocated to the last possible pipette type based on the pipette type association and, in which the number of components allocated to one pipette type is used to determine the number of pipettes of that pipette type to be selected.

16. The apparatus as claimed in claim 15, in which the processor is set up in such a manner that the method is carried out for a different number of cycles in each case.

17. An automatic placement machine having an apparatus as claimed in claim 15 further comprising:

a component memory for the component, a placement head for picking up pipettes, at least one pipette for picking up components, a placement device for placing the components on a printed circuit.

18. An apparatus for computer-aided pipette selection for a placement head of an automatic placement machine and for allocation of components to the pipette types predetermined in a pipette selection for a given number of cycles z, comprising:

a memory for storing a component type list B, a pipette type list B and an allocation list E; and a processor which is coupled to the memory and stores the following for processing:

a stored component type list B with the respectively associated number of components of the component type to be placed, a stored pipette type list P of available pipette types and an allocation list E which indicates which component types can be placed by what pipette types, a check is carried out to determine whether a permissible component type association exists, such that $$(b1, p) \in E, (b2, p) \in E, b1 \leq b \leq b2 \rightarrow (b, p) \in E,$$

where
b1, b2, b components in the component type list B are denoted, (b, p)∈E, b∈B , p∈P, denotes the situation where a component of component type b can be placed using a pipette of pipette type p, in which, based on the permissible component type association for the pipette types p∈P, a pipette type association is formed in such a manner that:

$$p1 \leq p2 \rightarrow (1(p1) < 1(p2)) \vee ((1(p1) = 1(p2)) \wedge f(p1) \geq f(p2))),$$

where
p1, p2∈P denote different pipette types,
1(p), p∈P, is defined by $$1(p) = \max\{b \in B | (b, p) \in E\},$$

f(p), p∈P, is defined by $$f(p)) = \min\{b \in B | (b, p) \in E\},$$

in which the components are successively allocated to the pipette types, in a sequence which results from the component type association, in the following manner:

if, for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z;

if any components of this component type remain, then the remaining components are allocated to the last possible pipette type based on the pipette type association and, in which the number of components allocated to one pipette type is used to determine the number of pipettes of that pipette type to be selected.

19. The apparatus as claimed in claim 18,
in which the processor is set up in such a manner that
in the situation where no permissible component type association exists, the allocation list E is reduced in size and based on the component types and the pipette types, as many components as possible are allocated successively for each pipette type to the respective pipette type so that a component type association to the component types exists for the resultant allocation list E in such a manner that:

$(b1, p) \in E, (b2, p) \in E, b1 \leq b \leq b2 \rightarrow (b, p) \in E,$ in which, for the pipette types p∈P a pipette type association is formed in such a manner that:

$P1 \leq P2 \rightarrow (1(P1) < 1(P2)) \vee ((1(P1) = 1(P2)) \hat{} f(P1) \geq f(P2))),$ the components are successively allocated to the pipette types, in a sequence which results from the component type association, in the following manner:
if, for a component type, pipette types exist to which any given multiple of the number of cycles z of large numbers of components are not already allocated, then the pipette types are first allocated to components on the basis of the pipette type association, in such a manner that the number of allocated components is rounded up to the next multiple of the number of cycles z;
if any components of this component type remain, then the remaining components re allocated to the last possible pipette type based on the pipette type association and,
the number of components allocated to one pipette type is used to determine the number of pipettes of that pipette type to be selected.

20. The apparatus as claimed in claim 18, in which the processor is set up in such a manner that in the situation where no permissible component type association exists, the solution to be determined is found by solving a sequence of flow problems.

21. The apparatus as claimed in claim 18,
in which the processor is set up in such a manner that
in the situation where no permissible component type association exists, a check is carried out to determine whether a set of trees with the pipette types as nodes of the trees can be determined for possible allocations of the component types to the pipette types in accordance with the allocation list E, so that each sub-graph, which is induced from a set of pipette types P(b) which can place a component b, in the set of trees is cohesive, and
if such a set of trees can be determined, the solution to be determined is found by solving a sequence of flow problems.

22. The apparatus as claimed in claim 18,
in which the processor is set up in such a manner that
in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive,
if such a set of trees cannot be determined, elements are deleted from the allocation list E until such a set of trees can be determined, and
the solution to be determined is found by solving a sequence of flow problems.

23. The apparatus as claimed in claim 20,
in which the processor is set up in such a manner that the sequence of flow problems is formed in accordance with the following rules:

$$\sum_{p:(b,p) \in E} x_{bp} = n_b \quad \forall\, b \in B$$

$$\sum_{p:(b,p) \in E} x_{bp} \leq c_b \quad \forall\, p \in P$$

where
$n_b$ indicates a number of components of the component type b∈E to be placed,
$c_p$, p∈P denotes a window which can be predetermined and which is varied in association to form the sequence of flow problems,
a first solution variable $x_{bp}$ indicates how many components of the component type b∈B are placed by a pipette of the pipette type p∈P.

24. The apparatus as claimed in claim 18,
in which the processor is set up in such a manner that
in the situation where no permissible association exists, a check is carried out to determine whether a set of trees with the pipette types as nodes of the trees can be determined for possible allocations of the component types to the pipette types in accordance with the allocation list, so that each sub-graph, which is induced by a set of pipette types P(b) which can place a component b, in the set of trees is cohesive, and
if such a set of trees cannot be determined, the solution to be determined is found by solving a linear program as the possible allocations are formulated.

25. The apparatus as claimed in claim 18,
in which the processor is set up in such a manner that
the linear program is formed in accordance with the following rules:

$$\sum_{p:(b,p) \in E} x_{bp} = n_b \quad \forall\, b \in B$$

$$\sum_{p:(b,p) \in E} x_{bp} \leq y_b \cdot z \quad \forall\, p \in P$$

$$\sum_{p \in P} y_p \leq k$$

where
$n_b$ indicates a number of components of the component type b∈E to be placed,
a first solution variable $x_{bp}$ indicates how many components of the component type b∈B are placed by a pipette of the pipette type p∈P;
a second solution variable yp indicates how many pipettes of the pipette type p∈P are selected,
k denotes a number of segments of the placement head, and x,y≧0 is an integer.

26. The apparatus as claimed in claim 25, in which the processor is set up in such a manner that the linear program is solved using a branch and cut method.

27. The apparatus as claimed in claim 18, in which the processor is set up in such a manner that the method is carried out for a different number of cycles in each case.

28. An automatic placement machine having an apparatus as claimed in claim 18 further comprising:

a component memory for the component, a placement head for picking up pipettes, at least one pipette for picking up components, a placement device for placing the components on a printed circuit.

* * * * *